US008947246B2

(12) United States Patent
Aiken

(10) Patent No.: US 8,947,246 B2
(45) Date of Patent: Feb. 3, 2015

(54) UTILITY METER ARC DETECTION SYSTEM

(75) Inventor: Brian Matthew Aiken, Atlanta, GA (US)

(73) Assignee: General Electric Company, Schenectady, NY (US)

( * ) Notice: Subject to any disclaimer, the term of this patent is extended or adjusted under 35 U.S.C. 154(b) by 792 days.

(21) Appl. No.: 13/227,199

(22) Filed: Sep. 7, 2011

(65) Prior Publication Data

US 2013/0057408 A1 Mar. 7, 2013

(51) Int. Cl.
*G08B 21/00* (2006.01)
*H02H 1/00* (2006.01)
*G01R 31/12* (2006.01)

(52) U.S. Cl.
CPC .......... *H02H 1/0023* (2013.01); *G01R 31/1218* (2013.01)
USPC ........................................................ 340/635

(58) Field of Classification Search
CPC .. G01R 22/063; G01R 22/065; G01R 22/066; G01R 22/068; G01R 19/2513; H02H 1/0015; H02H 1/0023; H02B 13/025; H01H 33/26
USPC ........................................................ 340/635
See application file for complete search history.

(56) References Cited

U.S. PATENT DOCUMENTS

| | | | | |
|---|---|---|---|---|
| 4,658,322 A * | 4/1987 | Rivera | ............................. | 361/37 |
| 6,093,975 A * | 7/2000 | Peticolas | ......................... | 290/52 |
| 6,141,192 A * | 10/2000 | Garzon | .............................. | 361/5 |
| 6,882,137 B1 | 4/2005 | Voisine | | |
| 7,130,722 B2 | 10/2006 | Soni | | |
| 7,282,924 B1 | 10/2007 | Wittner | | |
| 7,415,725 B2 * | 8/2008 | Henneberry et al. | ........... | 726/17 |
| 2002/0089802 A1* | 7/2002 | Beckwith | ......................... | 361/63 |
| 2003/0156367 A1 | 8/2003 | Macbeth | | |
| 2009/0161272 A1* | 6/2009 | Asokan et al. | .................. | 361/43 |
| 2010/0073831 A1* | 3/2010 | Schweitzer, III | ............... | 361/42 |
| 2010/0085671 A1* | 4/2010 | Allalouf et al. | .................. | 361/42 |
| 2010/0321838 A1* | 12/2010 | Wu et al. | .......................... | 361/42 |
| 2010/0328824 A1* | 12/2010 | Roscoe | ............................ | 361/42 |

* cited by examiner

*Primary Examiner* — Firmin Backer
*Assistant Examiner* — Nay Tun
(74) *Attorney, Agent, or Firm* — Hoffman Warnick LLC; Ernest G. Cusick

(57) ABSTRACT

Systems for detecting arcing faults inside a utility meter are disclosed. In one embodiment, an arc detection system for a utility meter is disclosed including: a photoreceptor sensor configured for placement within a utility meter housing; and a computing device communicatively connected to the photoreceptor sensor, the computing device adapted to monitor arcing events within the utility meter housing by performing actions comprising: obtaining illumination data about an area within the utility meter housing from the photoreceptor sensor; and analyzing the illumination data to determine whether an arcing event has occurred within the utility meter.

16 Claims, 4 Drawing Sheets

UTILITY METER ARC DETECTION SYSTEM

BACKGROUND OF THE INVENTION

The subject matter disclosed herein relates generally to meter technology. More particularly, the subject matter disclosed herein relates to tools for detecting arcing faults inside a utility meter.

Some utility companies, for example, certain electrical companies, employ utility meters (e.g., an electrical meter, a smart meter or any other form of meter configured to monitor utility service consumption at a location) to regulate and or record the amount of service (e.g. electricity) being consumed by a given location or consumer. These utility meters include a meter base which monitors service consumption at a given location via a connection with a set of terminal blades at a meter socket. In some meter systems (e.g., retrofitted meter systems, systems with degraded meter sockets, etc.), a poor connection may develop between the meter socket and the terminal blades. This poor connection may lead to arcing between components of the utility meter (e.g., the terminal blades and meter socket). This arcing may damage the utility meter, damage the meter socket, subject the utility meter to installed stress and/or loads, or cause a fire in the utility meter or at the location.

BRIEF DESCRIPTION OF THE INVENTION

Systems for detecting arcing faults inside a utility meter are disclosed. In one embodiment, an arc detection system for a utility meter is disclosed including: a photoreceptor sensor configured for placement within a utility meter housing; and a computing device communicatively connected to the photoreceptor sensor, the computing device adapted to monitor arcing events within the utility meter housing by performing actions comprising: obtaining illumination data about an area within the utility meter housing from the photoreceptor sensor; and analyzing the illumination data to determine whether an arcing event has occurred within the utility meter.

A first aspect of the disclosure provides an arc detection system for a utility meter including: a photoreceptor sensor configured for placement within a utility meter housing; and a computing device communicatively connected to the photoreceptor sensor, the computing device adapted to monitor arcing events within the utility meter housing by performing actions comprising: obtaining illumination data about an area within the utility meter housing from the photoreceptor sensor; and analyzing the illumination data to determine whether an arcing event has occurred within the utility meter.

A second aspect provides a program product stored on a computer readable medium, which when executed by at least one computing device, performs the following: obtain illumination data from a photoreceptor sensor connected to a utility meter housing; analyze the illumination data to determine if whether an arcing event has occurred within the utility meter; and provide an arc alert indicator for communication to at least one of a utility service provider or a user, the arc alert indicator indicating whether an arc event has occurred.

A third aspect provides a utility meter including: a meter base; a set of terminal blades connected to the meter base for complementing a utility meter socket; a photoreceptor sensor connected to the meter base for detecting variances in illumination between the set of terminal blades and the utility meter socket; and a computing device connected to the photoreceptor sensor, the computing device adapted to obtain illumination data from the photoreceptor sensor and analyze the illumination data to determine whether an arcing event has occurred within the utility meter.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
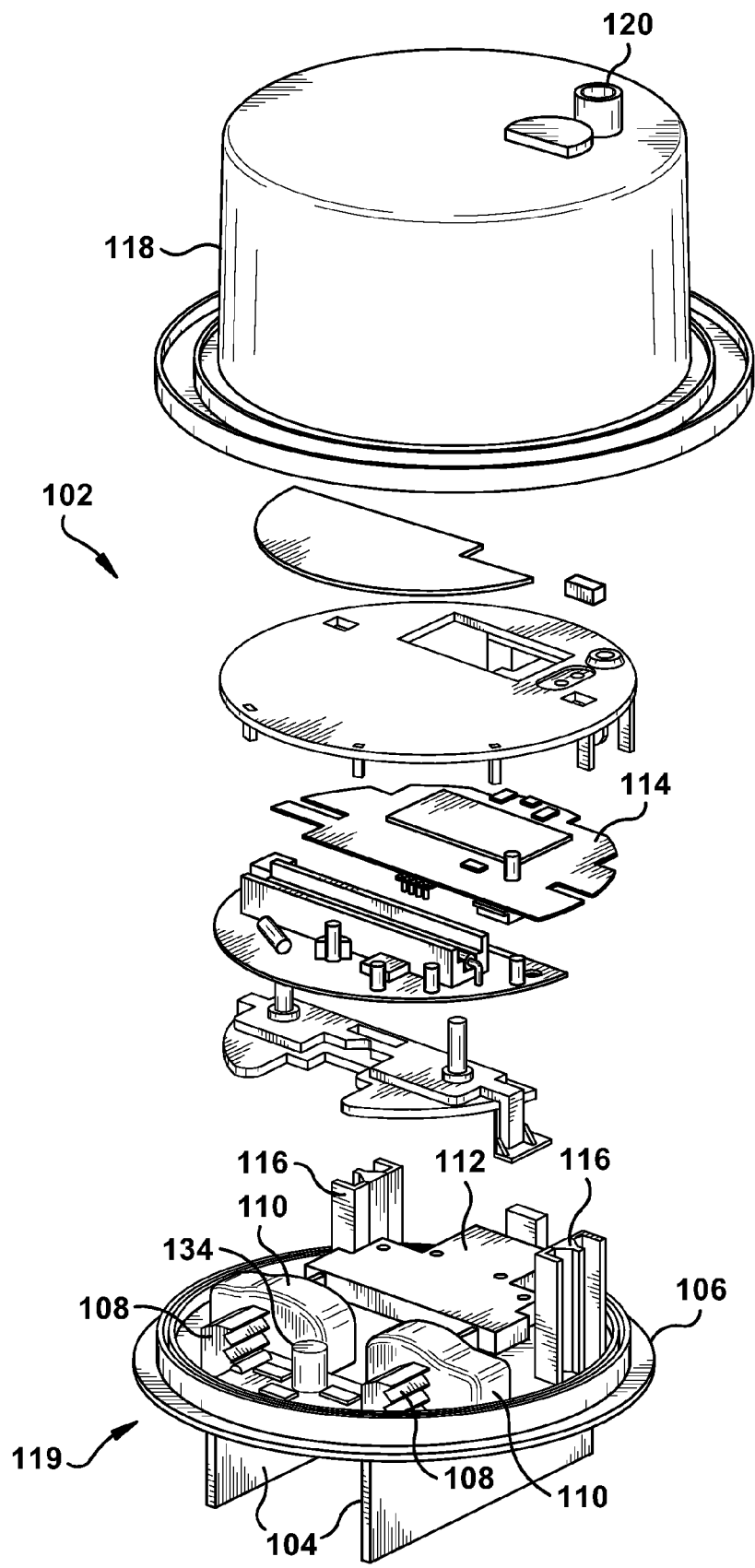
FIG. 1 shows a three-dimensional blow-out schematic illustration of portions of a utility meter in accordance with an embodiment of the invention.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION OF THE INVENTION

As indicated herein, aspects of the invention provide for systems configured to monitor arcing faults in a utility meter. These systems employ at least one photoreceptor sensor connected to a utility meter base and positioned to detect light and/or variances in light intensity associated with arcing in the utility meter housing.

Some utility meters use a meter base connected to a meter socket via a set of terminal blades to monitor and regulate service consumption at the meter socket location. However, in some of these utility meters, a degraded and/or poor connection may develop between the meter socket and the set of terminal blades as a result of a degraded meter socket, a poor fitting retrofit of a new meter base on an existing meter socket, etc. A poor connection between the meter socket and the set of terminal blades may result in arcing faults occurring within the utility meter. This arcing may damage components of the utility meter, damage the meter socket or cause a fire at the utility meter location.

Embodiments of the current invention provide for an arc detection system which uses a computing device (e.g., a meter base including a metering circuit) communicatively connected to a photoreceptor sensor disposed within a utility meter housing to monitor arc faults at the utility meter. The photoreceptor sensor is installed within the meter housing and positioned to detect light and/or variances in light intensity which are indicative of an arc fault within a meter socket enclosure. The metering circuit processes the data obtained from the photoreceptor sensor, and in response to a determination of an arc fault in the utility meter, the metering circuit may disconnect service at the utility meter and/or generate an arc alert indicator configured to notify a user and/or the utility service provider as to the arcing event.

As will be appreciated by one skilled in the art, the arc detection system described herein may be embodied as one or more systems, methods or computer program products. Accordingly, embodiments of the present invention may take the form of an entirely hardware embodiment, an entirely software embodiment (including firmware, resident software, micro-code, etc.) or an embodiment combining software and hardware aspects that may all generally be referred to herein as a "circuit," "module," "network" or "system." Furthermore, the present invention may take the form of a computer program product embodied in any tangible medium of expression having computer-usable program code embodied in the medium.

Any combination of one or more computer usable or computer readable medium(s) may be utilized. The computer-useable or computer-readable medium may be, for example but not limited to, an electronic, magnetic, optical, electromagnetic, infrared, or semiconductor system, apparatus, or device. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Turning to the FIGURES, embodiments of an arc detection system are shown, where the arc detection system may use a photoreceptor sensor disposed within a utility meter to monitor light emissions associated with arcing in the utility meter. Each of the components in the FIGURES may be connected via conventional means, e.g., via wireless mesh, WiFi, power line communication, cellular, and/or other known means as is indicated in the FIGS. 1-4. Specifically, referring to FIG. 1, a three-dimensional blow-out schematic illustration of portions of an electronic utility meter 102 is shown with hardware components. Electronic utility meter 102 illustrated in FIG. 1 is an electronic watt-hour meter which includes terminal blades 104, a meter base 106, potential links 108, current transformers 110, a switch 112 to turn on and off service, a metering circuit 114 supported by metering circuit brackets 116, a cover 118 to protect components, a photoreceptor sensor 134 and an actuatable button 120 for activating switch 112. The various features which may be available to a consumer/user via hardware components such as metering circuit 114, potential links 108, current transformers 110 etc. may be enabled or disabled by feature licenses. In this embodiment, electronic utility meter 102 is configured to be installed in a utility meter housing 207 (shown in FIG. 2) and connected to a complementary utility meter socket 250 (shown in FIG. 2). In one embodiment, photoreceptor sensor 134 is positioned to detect light on one side of meter base 106. In one embodiment, photoreceptor sensor 134 may be connected to metering circuit 114. In another embodiment, a portion of photoreceptor sensor 134 is positioned to extend through meter base 106. In one embodiment, the photoreceptor of photoreceptor sensor 134 is positioned between terminal blades 104. In one embodiment, the photoreceptor of photoreceptor sensor 134 is positioned on an opposite side of meter base 106 relative switch 112. In one embodiment, photoreceptor sensor 134 is located on metering circuit 114 and is optically connected to a back side 119 of meter base 106 via an optical medium (e.g., light pipe, fiber optic, etc.).

Figure 2:
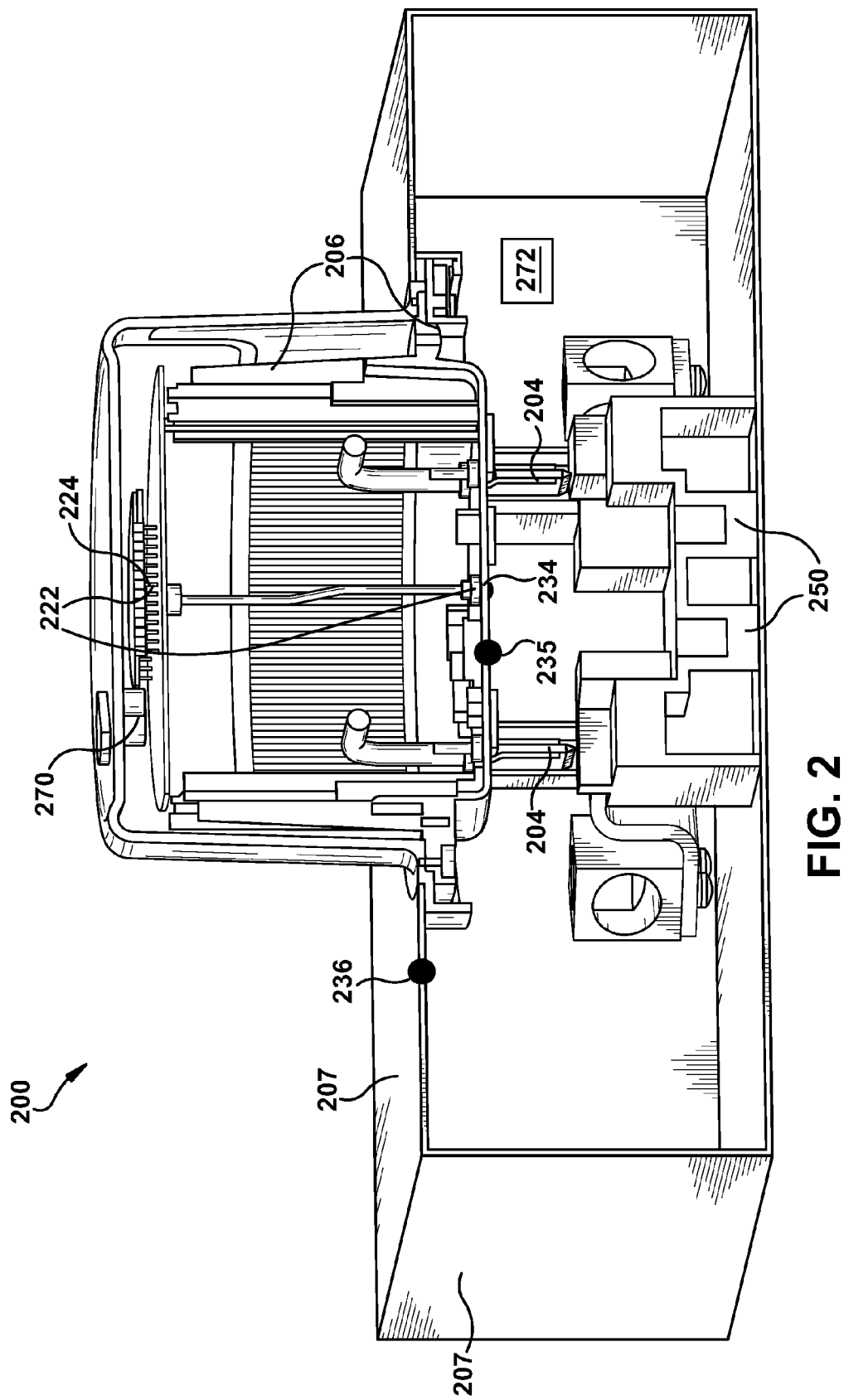
FIG. 2 shows a partial cut-away schematic view of a utility meter in accordance with an embodiment of the invention.

Turning to FIG. 2, a schematic partial cut-away view of a utility meter 200 including an arc detection system 222 is shown according to embodiments of the invention. It is understood that elements similarly numbered between FIG. 1 and FIG. 2 may be substantially similar as described with reference to FIG. 1. Further, in embodiments shown and described with reference to FIGS. 2-4, like numbering may represent like elements. Redundant explanation of these elements has been omitted for clarity. Finally, it is understood that the components of FIGS. 1-4 and their accompanying descriptions may be applied to any embodiment described herein.

Returning to FIG. 2, in this embodiment, utility meter 200 may include a utility meter housing 207 in which a meter base 206 is connected to a utility meter socket 250 via a set of terminal blades 204. Meter base 206 monitors service consumption at utility meter 200 via the connection with set of terminal blades 204, and includes a first photoreceptor sensor 234 configured to monitor a light condition within utility meter housing 207 and/or utility meter socket 250. First photoreceptor sensor 234 is connected to a computing device 224 for determining which light conditions and detected variances in light conditions within utility meter housing 207 are indicative of arcing/an arcing event. For example, as more fully described herein, an arc event may, for example, generate a series of sparks or flashes which increase the brightness/light level within utility meter housing 207. In this embodiment, first photoreceptor sensor 234 includes a photocell.

Photocells are designed to sense a level and/or intensity of light. Accordingly, first photoreceptor sensor 234 may sense a level of illumination and variances from that illumination within utility meter housing 207. In one embodiment, first photoreceptor sensor 234 may be configured to detect an intensity of light within utility meter housing 207 above a predetermined level. In one embodiment, first photoreceptor sensor 234 may be configured, for example, to sense a predetermined flash or pattern of flashes within utility meter socket 250. In one embodiment, in response to first photoreceptor sensor 234 detecting an arcing event (e.g., sensing a sudden increase in illumination within utility meter housing 207); computing device 224 notifies a service provider and/or a user of the arcing event. In one embodiment, computing device 224 may include metering circuit 114 (shown in FIG. 1). In one embodiment, first photoreceptor sensor 234 is oriented toward utility meter socket 250.

In an embodiment of the invention, computing device 224 may be configured to process data obtained from first photoreceptor sensor 234. In one embodiment, computing device 224 may be configured to analyze a frequency of detected light conditions within utility meter housing 207 to determine if a series of variances in light conditions (e.g., frequent changes in intensity, a pattern of alternating intensity, etc.) are indicative of an arcing event. In another embodiment, computing device 224 may be configured to analyze a frequency of detected light conditions to determine an intensity of arcing within utility meter housing 207. In another embodiment, in response to an arcing event, computing device 224 may generate an arcing alert for communication to the service provider and/or a user through an Advanced Metering Infrastructure (AMI) via utility meter 200. The arcing alert indicates a light level within utility meter socket 250 which is beyond the established boundary conditions of illumination for utility meter housing 207 and/or utility meter socket 250 (e.g., indicative of an arcing event). In another embodiment of the invention, computing device 224 and/or arc detection system 222 may be integrated into utility meter 200.

In another embodiment of the invention, computing device 224 is communicatively connected to a second photoreceptor sensor 235 connected to meter base 206. Second photoreceptor sensor 235 can monitor a light condition within utility meter socket 250, thereby providing redundancy to arc detection system 222. In one embodiment, computing device 224 uses and compares data obtained from both first photoreceptor sensor 234 and second photoreceptor sensor 235 to determine a status of the connection between mater base 206 and utility meter socket 250. In another embodiment, computing device 224 may be communicatively connected to a third photoreceptor sensor 236. Third photoreceptor sensor 236 may be connected to meter base 206 and/or utility meter housing 207 and configured to monitor a light condition (e.g., daytime, nighttime, sunny, cloudy, etc.) external to utility meter housing 207. Third photoreceptor sensor 236 may transmit the external light condition to computing device 224 which may use the external light condition to analyze data obtained from first photoreceptor sensor 234. In one embodiment, computing device 224 may use the external light condition to determine a set of boundary conditions for luminary intensity within utility meter housing 207 (e.g., a greater amount of illumination tolerated during daylight hours as opposed during nighttime hours).

In one embodiment, utility meter 200 includes a switch 212 which may be activated to switch utility meter 200 between different states (e.g., an off position, an armed position, and an on position). Switch 212 may include a manual switch and/or a remote disconnect switch. In one embodiment, switch 212 may include a receiver 226 for receiving remote instructions for changing positions, and thereby, states of utility meter 200 (e.g., from the off position to the armed position etc.). Instructions may be sent via, for example, radio signals, wires, AMI, or by any other known means of communication. In one embodiment, first photoreceptor sensor 234 may be configured to change the state of the switch 212 in response to a detected arcing event. In another embodiment, computing device 224 may be configured to change the state of the switch 212 in response to a detected arcing event. In one embodiment, a user may receive instructions (by any known means) to connect or disconnect service to utility meter 200 via switch 212 in response to a detection of a specified light intensity/light level within utility meter socket 250. Any intensity of light and/or any combination or pattern of flashes detected by first photoreceptor sensor 234 may be used to detect an arcing event.

It is understood that as described herein, photoreceptor sensors 234, 235 and 236 may include one or more conventional light detecting or other sensor devices including but not limited to: a photoresistor, a photodiode, a photovoltaic cell, a charge-coupled device, etc.

In another embodiment, meter base 206 includes a user interface 270 for a user to communicate with arc detection system 222. User interface 270 may include a display such as a light emitting diode (LED) display. User interface 270 may provide information (e.g., instructions for user, a status of utility meter 200, an arcing event, past arc events etc.) to the user in the form of visual symbols, letters, numerals, colors, and other modes of visual communication. In another embodiment, meter base 206 may include an audio device 272. Audio device 272 is configured to provide information to a user in the form of tones, words, and other modes of aural communication. Information may include instructions for user, a status of utility meter 200, an arcing event, past arc events etc.

In any event, computing device 224 can comprise any general purpose computing article of manufacture capable of executing computer program code installed by a user (e.g., a personal computer, server, handheld device, etc.). However, it is understood that computing device 224 and utility meter 200 are only representative of various possible equivalent computing devices that may perform the various process steps of the disclosure. To this extent, in other embodiments, computing device 224 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

As previously mentioned and discussed further below, arc detection system 222, has the technical effect of enabling computing device 224 to perform, among other things, the monitoring, analysis and/or notification functions described herein. It is understood that some of the various components shown in FIGS. 1-4 can be implemented independently, combined, and/or stored in memory for one or more separate computing devices that are included in computing device 224. Further, it is understood that some of the components and/or functionality may not be implemented, or additional schemas and/or functionality may be included as part of arc detecting system 222. The arc detecting system of the present disclosure is not limited to any one particular meter, electrical meter, smart meter, network or other system, and may be used with other power and communication systems. Additionally, the arc detection system of the present invention may be used with other systems not described herein that may benefit from the accurate, secure, real-time arc monitoring and data communications link provided by the arc detection system described herein.

Figure 3:
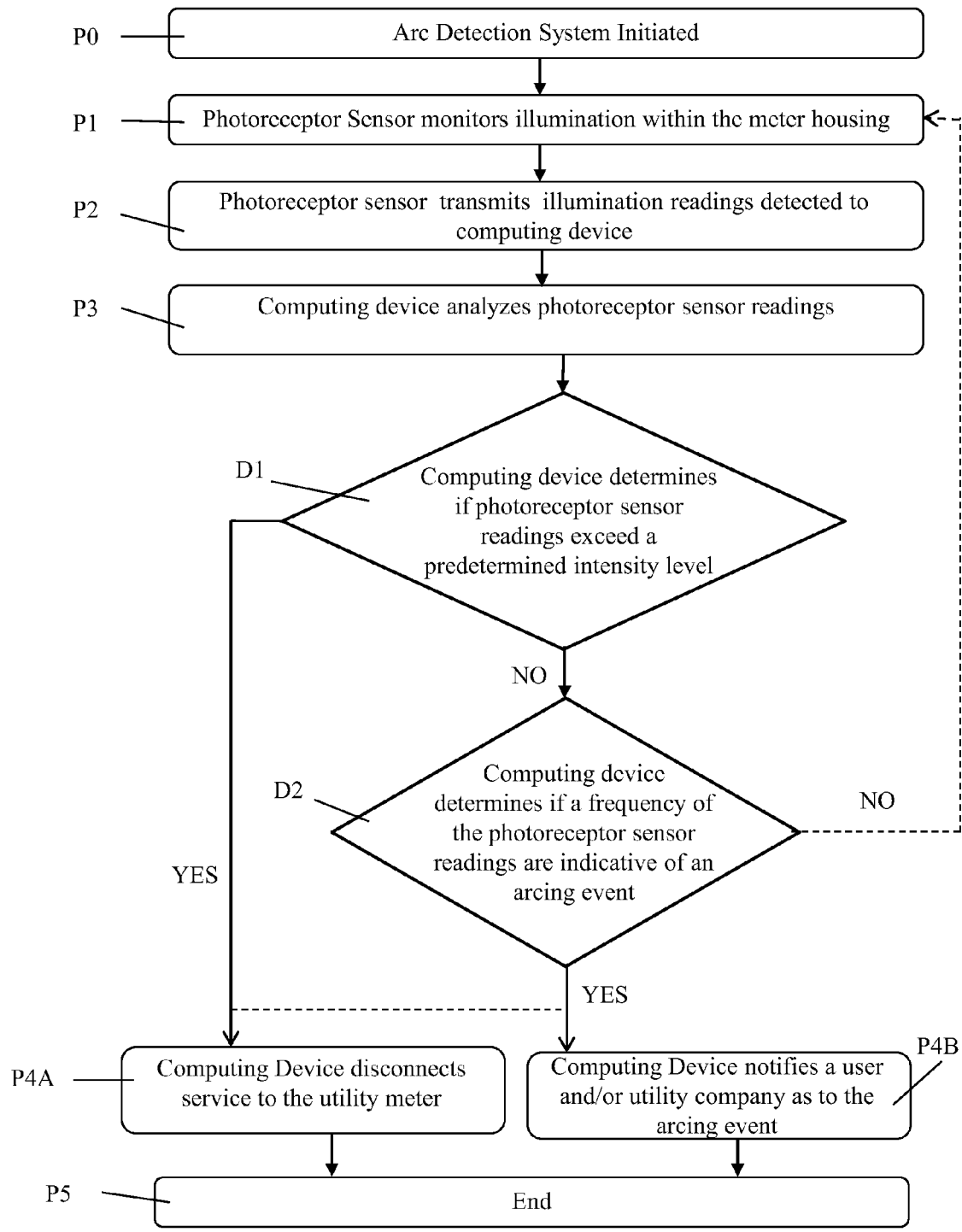
FIG. 3 shows a method flow diagram illustrating a process according to embodiments of the invention.

Turning to FIG. 3, an illustrative method flow diagram is shown according to embodiments of the invention: In pre-process P0, arc detection system 222 receives a scheduled or user-prompted start indicator to begin monitoring illumination within utility meter housing 207. Following pre-process P0, in process P1, first photoreceptor sensor 234 monitors light conditions within utility meter housing 207, detecting variances in intensity, frequency of changes in intensity, etc. Following process P1, in process P2, first photoreceptor sensor 234 transmits readings detected within utility meter housing 207 to computing device 224. That is, computing device 224 receives recent or real-time illumination readings for utility meter housing 207 from first photoreceptor sensor 234. Following process P2, in process P3, computing device 224 analyzes the photoreceptor sensor readings (e.g., compares the obtained illumination readings for utility meter housing 207 with the pre-defined or developed light variance data, light intensity data, etc. for utility meter housing 207). In one embodiment, the boundary conditions may be pre-set and or established by a user or the utility service provider. In another embodiment, the boundary conditions may be established by arc detection system 222, the boundary conditions developed by arc detection system 222 based upon stored illumination data for utility meter housing 207 (e.g., light intensity as a function of time of day, etc.).

Following process P3, in decision D1, arc detection system 222 determines if the values of the obtained photoreceptor sensor readings from utility meter housing 207 are beyond the established boundary conditions for utility meter housing 207. After decision D1, if values for the photoreceptor readings are determined to be beyond the boundary conditions for utility meter housing 207 and thus indicative of an arcing event, then at process P4A, computing device 224 disconnects service to utility meter 200. Or, alternatively at P4B, computing device 224 provides an arc alert indicator to any of a utility network, an emergency network, and/or a family network. The arc alert indicator alerts any of the networks to an arcing event at utility meter 200. Following either of P4A or P4B, at process P5, the process ends. However, if after performing decision D1, arc detection system 222 determines that values for the photoreceptor readings do not exceed the boundary conditions, then in decision D2, arc detection system 222 determines whether a frequency of detected light variances is indicative of an arcing event. After D2, if values for the frequency of photoreceptor readings are determined to have a frequency indicative of an arcing event, then at process P4A, computing device 224 disconnects service to utility meter 200. Or, alternatively at P4B, computing device 224 provides an arc alert indicator to any of a utility network, an emergency network, and/or a family network. The arc alert indicator alerts any of the networks to an arcing event at utility meter 200. Following either of P4A or P4B, at process P5, the process ends. However if after performing D2 arc detection system 222 determines that values for the photoreceptor readings do not display a frequency indicative of an arcing event, then back at process P1 first photoreceptor sensor 234 monitors illumination within utility meter housing 207.

The data flow diagram and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 4:
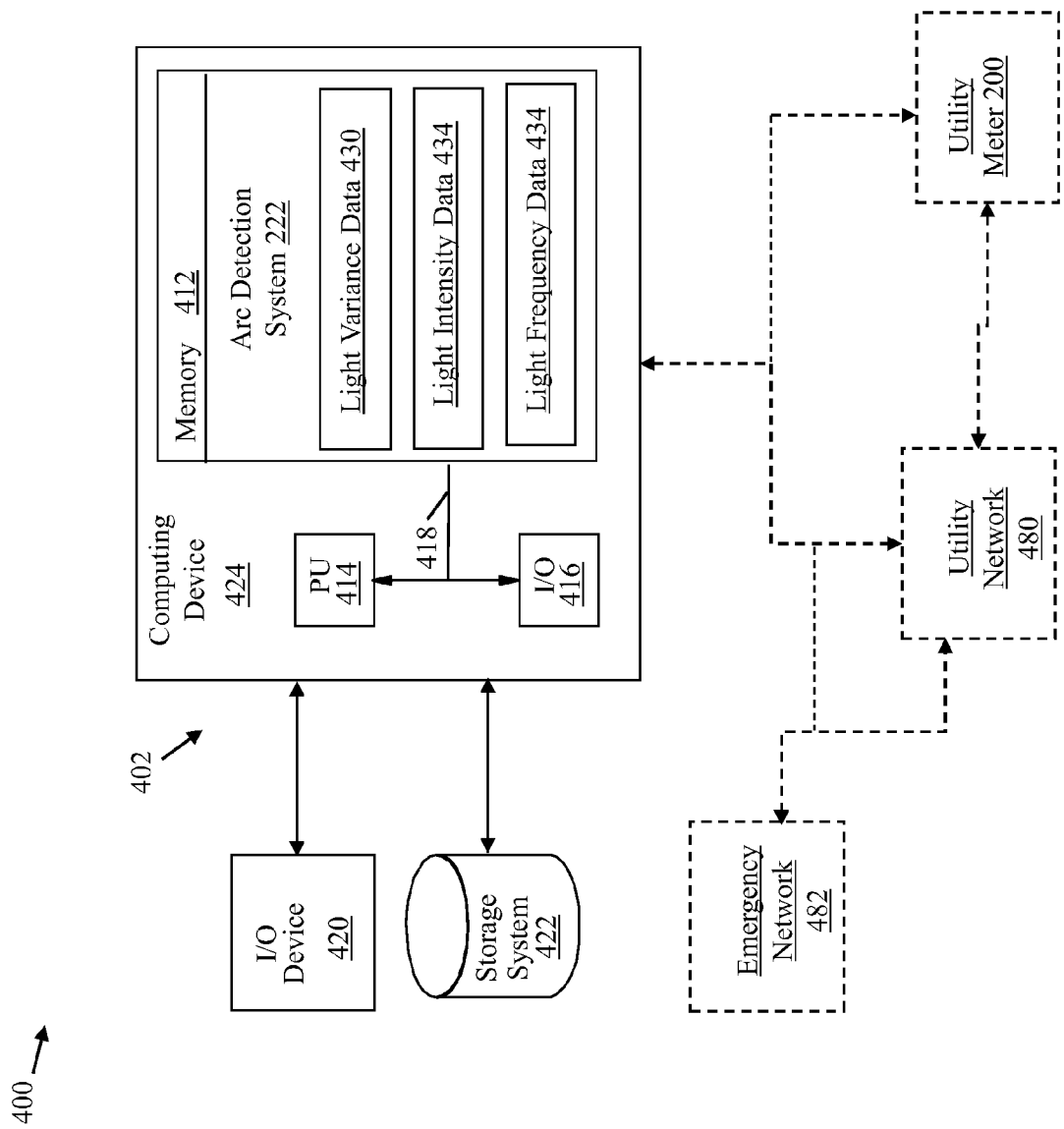
FIG. 4 shows a schematic illustration of an environment including an arc detection system in accordance with an embodiment of the invention.

Turning to FIG. 4, an illustrative environment 400 including an arc detection system 222 is shown according to embodiments of the invention. Environment 400 includes a computer infrastructure 402 that can perform the various processes described herein. In particular, computer infrastructure 402 is shown including computing device 424 which includes arc detection system 222.

Computing device 424 is shown including a memory 412, a processor (PU) 414, an input/output (I/O) interface 416, and a bus 418. Further, computing device 424 is shown in communication with an external I/O device/resource 420 and a storage system 422. As is known in the art, in general, processor 414 executes computer program code, such as arc detection system 222, that is stored in memory 412 and/or storage system 422. While executing computer program code, processor 414 can read and/or write data (e.g., illumination data), such as light variance data 430, light intensity data 432, and/or light frequency data 434, to/from memory 412, storage system 422, and/or I/O interface 416. Bus 418 provides a communications link between each of the components in computing device 424. I/O device 420 can comprise any device that enables a user to interact with computing device 424 or any device that enables computing device 424 to communicate with one or more other computing devices. Input/output devices (including but not limited to keyboards, displays, pointing devices, etc.) can be coupled to the system either directly or through intervening I/O controllers.

In some embodiments, as shown in FIG. 4, environment 400 may optionally include a utility network 480 and/or an emergency network 482 communicatively connected to arc detection system 222 through computing device 424 (e.g., via wireless or hard-wired means). In some embodiments, computing device 424 and/or arc detection system 222 may be disposed upon or within utility meter 200 (shown in FIG. 2). In one embodiment, arc detection system 222 may transmit an arc alert to either or both of utility network 480 and emergency network 482 via utility meter 200. In another embodiment, arc detection system 222 may directly transmit an arc alert to either or both of utility network 480 and emergency network 482.

As discussed herein, various systems and components are described as "obtaining" data (e.g., service consumption data, temperatures, dependency data, health condition, etc.). It is understood that the corresponding data can be obtained using any solution. For example, the corresponding system/component can generate and/or be used to generate the data, retrieve the data from one or more data stores or sensors (e.g., a database), receive the data from another system/component, and/or the like. When the data is not generated by the particular system/component, it is understood that another system/component can be implemented apart from the system/component shown, which generates the data and provides it to the system/component and/or stores the data for access by the system/component.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An arc detection system for a utility meter, the arc detection system comprising:
    a first photoreceptor sensor configured for placement within a utility meter housing;
    a computing device communicatively connected to the photoreceptor sensor, the computing device adapted to monitor arcing events within the utility meter housing by performing actions comprising:
        obtaining illumination data about an area within the utility meter housing from the photoreceptor sensor; and
        analyzing the illumination data to determine whether an arcing event has occurred within the utility meter; and
    a second photoreceptor sensor connected to the computing device,
    the computing device analyzing illumination data from both the first photoreceptor sensor and the second photoreceptor sensor to determine whether an arcing event has occurred within the utility meter, wherein the second photoreceptor sensor is configured to obtain illumination data external to the utility meter housing.

2. The arc detection system of claim 1, wherein the computing device is a metering circuit.

3. The arc detection system of claim 1, the computing device further configured to provide an arc alert indicator for communication to at least one of a utility service provider or a user, the arc alert indicator indicating the arcing event has occurred.

4. The arc detection system of claim 1, the computing device further configured to disable service at the utility meter in response to the arcing event.

5. The arc detection system of claim 1, wherein the analyzing includes detecting the presence of variances in light conditions in the area.

6. The arc detection system of claim 1, wherein the analyzing of the illumination data further includes:
    comparing light intensity values from the obtained illumination data with a set of predetermined light intensity values for the utility meter housing; and
    comparing a frequency of detected light variances from the obtained illumination data with a set of predetermined frequencies for light variances within the utility meter housing.

7. A program product stored on a non-transitory computer readable medium, which when executed by at least one computing device communicatively connected to a utility meter, performs the following:
    obtain illumination data from both a first photoreceptor sensor and a second photoreceptor sensor connected to a utility meter housing,
    wherein the illumination data from the second photoreceptor sensor includes illumination data obtained external to the utility meter housing;
    analyze the illumination data from both the first photoreceptor sensor and the second photoreceptor sensor to determine whether an arcing event has occurred within the utility meter; and
    provide an arc alert indicator for communication to at least one of a utility service provider or a user, the arc alert indicator indicating whether an arc event has occurred.

8. The program product of claim 7, wherein the computing device is a metering circuit.

9. The program product of claim 7, wherein the providing of the arc alert indicator further includes: disabling service at the utility meter.

10. The program product of claim 7, wherein the analyzing includes detecting the presence of variances in light conditions in an area within the utility meter housing.

11. The program product of claim 7, wherein the analyzing of the illumination data further includes:
    comparing light intensity values from the obtained illumination data with a set of predetermined light intensity values for the utility meter housing; and
    comparing a frequency of detected light variances from the obtained illumination data with a set of predetermined frequencies for light variances within the utility meter housing.

12. An electronic utility meter, comprising:
    a meter base;
    a set of terminal blades connected to the meter base for complementing a utility meter socket;
    a first photoreceptor sensor connected to the meter base for detecting variances in illumination between the set of terminal blades and the utility meter socket;
    a computing device connected to the photoreceptor sensor, the computing device adapted to obtain illumination data from the photoreceptor sensor and analyze the illumination data to determine whether an arcing event has occurred within the utility meter; and
    a second photoreceptor sensor connected to the computing device,
    the computing device analyzing illumination data from both the first photoreceptor sensor and the second photoreceptor sensor to determine whether an arcing event has occurred within the utility meter, wherein the second photoreceptor sensor is configured to obtain illumination data external to the utility meter housing.

13. The electronic utility meter of claim 12, wherein the computing device includes a metering circuit.

14. The electronic utility meter of claim 13, further comprising a switch operatively coupled to the metering circuit for switching the metering circuit between different states.

15. The electronic utility meter of claim 14, wherein the computing device is configured to change a state of the switch in response to the illumination data indicating an arcing event.

16. The electronic utility meter of claim 12, further comprising a user interface connected to the meter base.

* * * * *